United States Patent
Moreland et al.

(10) Patent No.: US 6,822,519 B1
(45) Date of Patent: Nov. 23, 2004

(54) SYNTHESIZER STRUCTURES AND ALIGNMENT METHODS THAT FACILITATE QUADRATURE DEMODULATION

(75) Inventors: Carl W. Moreland, Oak Ridge, NC (US); Bryan S. Puckett, Stokesdale, NC (US)

(73) Assignee: Analog Devices, Inc., Norwood, MA (US)

( * ) Notice: Subject to any disclaimer, the term of this patent is extended or adjusted under 35 U.S.C. 154(b) by 124 days.

(21) Appl. No.: 10/364,162

(22) Filed: Feb. 10, 2003

(51) Int. Cl.[7] ................................................ H03L 7/00
(52) U.S. Cl. ..................... 331/16; 531/1 A; 531/17; 531/25; 531/14; 531/177 V
(58) Field of Search ..................... 331/1 A, 17, 25, 331/14, 177 V

(56) References Cited

U.S. PATENT DOCUMENTS

| | | | |
|---|---|---|---|
| 4,749,961 A | * 6/1988 | Kato et al. | ..................... 331/14 |
| 5,576,666 A | 11/1996 | Rauvola | |
| 5,942,949 A | 8/1999 | Wilson et al. | |
| 6,137,368 A | * 10/2000 | Cho | ............................. 331/16 |
| 6,154,095 A | 11/2000 | Shigemori et al. | |
| 6,236,278 B1 | * 5/2001 | Olgaard | ....................... 331/25 |
| 6,337,600 B1 | 1/2002 | Shigemori et al. | |
| 6,359,950 B2 | 3/2002 | Gossmann et al. | |

OTHER PUBLICATIONS

"Phase–Locked Loops for High–Frequency Receivers and Transmitters", Parts 1–3, Analog Dialogue 33–3, 5 and 7, 1999, Analog Devices, Inc., Norwood, MA.

* cited by examiner

*Primary Examiner*—Michael Shingleton
(74) *Attorney, Agent, or Firm*—Koppel, Jacobs, Patrick & Heybl

(57) ABSTRACT

Synthesizer structures and alignment methods are provided that facilitate quadrature demodulation. The structures are realized with phase-locked loops that include half-rate frequency dividers to provide loop output signals with a wide range of output frequencies and with frequency dividers that provide quadrature signals in response to the output signals. The structures include controllers that direct alignment methods which lock a VCO to a reference signal from a reference frequency divider to thereby provide the output signals.

31 Claims, 4 Drawing Sheets

SYNTHESIZER STRUCTURES AND ALIGNMENT METHODS THAT FACILITATE QUADRATURE DEMODULATION

BACKGROUND OF THE INVENTION

1. Field of the Invention

The present invention relates generally to frequency synthesizers and, more particularly, to frequency synthesizers that provide local oscillator signals.

2. Description of the Related Art

An important class of frequency synthesizers utilize phase-locked loops to provide output signals from voltage-controlled oscillators (VCOs) that are phase-coherent with a reference signal (e.g., the signal of a crystal-controlled oscillator). Within the bandwidth of the phase-locked loop, the spectral quality of the output signals is thus a function of the spectral quality of the reference oscillator. Synthesizers typically generate a large number of signals by changing the divisor of a frequency divider which is positioned in the feedback loop. Accordingly, the output signals are spaced apart by the reference frequency of the reference signal.

The output signal range of a phase-locked loop is, however, limited by the tuning range of the VCO. Although this tuning range is often enhanced by providing band capacitors which can be selectively coupled in parallel with the VCO's tank circuit, it is still insufficient for many applications. For example, different providers of portable handset receivers for wireless communication systems (e.g., the global system for mobile communications (GSM)) have devised different designs which require different intermediate-frequency (IF) local oscillator (LO) frequencies and, accordingly, a synthesizer of these LO signals should preferably generate a wide range (e.g., 70–300 MHz) of signals.

In addition, the reference frequency is preferably selectable in order to alter the locations of spurious signals in the synthesizer's output signals. Receiver synthesizer design is further complicated because modulation strategies (e.g., gaussian minimum shift keying (MSK)) of wireless communication systems typically require quadrature LO signals (i.e., first and second LO signals that are phase offset by 90°) for quadrature demodulation.

Finally, it is highly desirable that wireless receiver synthesizers automatically align themselves at receiver start-up to provide any selected frequency within the required LO signal range. Current synthesizers have generally failed to adequately meet these multiple requirements for generation of spectrally-pure, wide-range, quadrature synthesizer signals with automatic start-up alignment.

BRIEF SUMMARY OF THE INVENTION

The present invention is directed to synthesizer structures and alignment methods that facilitate quadrature demodulation. These goals are realized with phase-locked loops that include half-rate frequency dividers to provide loop output signals with a wide range of output frequencies, with frequency dividers that provide quadrature signals in response to the output signals and with controllers that direct alignment methods which lock a VCO to a reference signal from a reference frequency divider to thereby provide the output signals.

The novel features of the invention are set forth with particularity in the appended claims. The invention will be best understood from the following description when read in conjunction with the accompanying drawings.

DETAILED DESCRIPTION OF THE INVENTION

Figure 1:
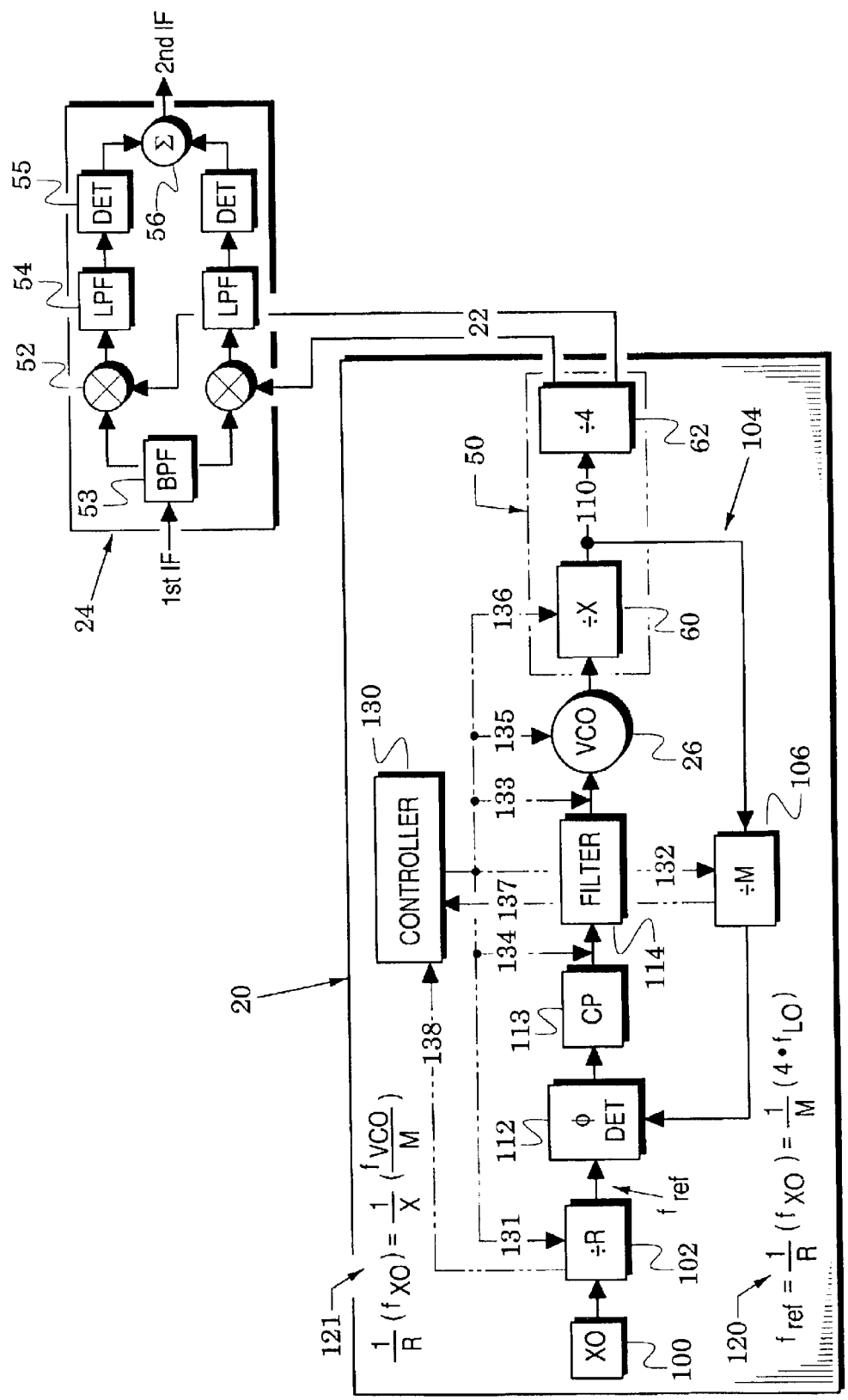
FIG. 1 is a block diagram of a synthesizer embodiment of the present invention.

FIG. 1 illustrates a synthesizer embodiment 20 that provides quadrature LO signals 22 to a quadrature demodulator 24 for the conversion of a 1st IF signal to a 2nd IF signal. The synthesizer's LO signals are generated by a VCO 26 which is shown in FIG. 2A to have an input port 27 for application of a control voltage $V_c$ and an output port 28 that provides the VCO's output signal $S_{out}$.

Figures 2A, 2B:
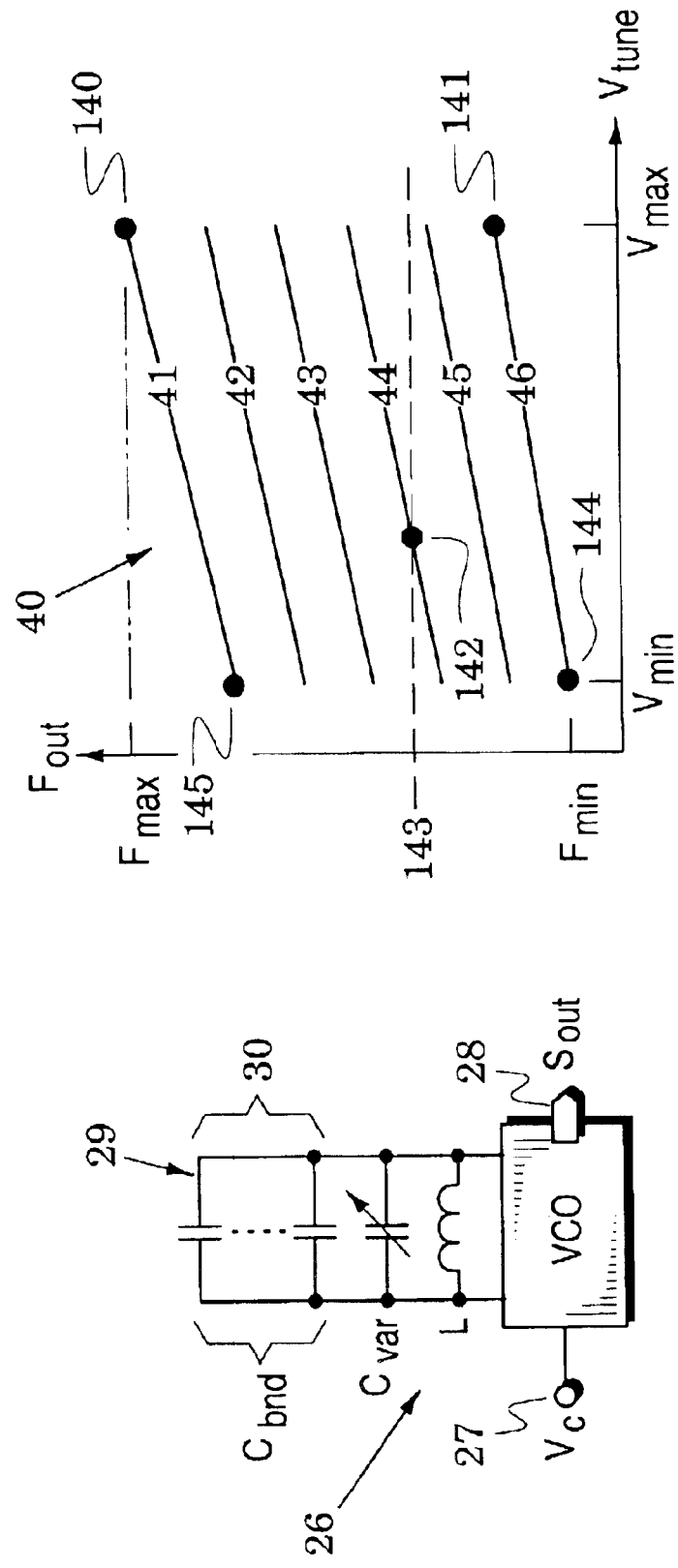
FIG. 2A is a diagram of a VCO and its tank circuit in the synthesizer of FIG. 1.
FIG. 2B is a diagram that shows selectable plots of frequency versus control voltage $V_c$ for the VCO of FIG. 2A.

The VCO's output frequency is set by the resonance of its tank circuit 29 which is formed in FIG. 2A by an inductor L and a variable capacitor $C_{var}$ (e.g., a varactor) whose capacitance is a function of the control voltage $V_c$. Because the resultant tuning range is limited by the range of the variable capacitor $C_{var}$, the tank circuit 29 is preferably supplemented with a plurality of fixed band capacitors 30 which can be selectively coupled (e.g., with switched transistors) into the tank circuit to thus alter the circuit's capacitance.

The graph 40 of FIG. 2B illustrates an exemplary plot 41 of the VCO's output frequency as a function of the control voltage $V_c$. This plot corresponds to the basic tank circuit (i.e., prior to addition of any band capacitors) and indicates a VCO embodiment in which greater control voltages decrease the varactor capacitance (the slope of the plot 41 would reverse for a VCO embodiment in which greater control voltages increase the varactor capacitance).

Additional plots 42–46 show the VCO's output frequency as a function of the control voltage $V_c$ after addition of 1, 2, 3, 4 and 5 band capacitors (it is noted that each band capacitor may actually be formed by one or more unit capacitors). With addition of each band capacitor, the variable capacitor $C_{var}$ represents less and less of the total tank capacitance and the slopes of the plots 24–46 successively decrease.

As shown in FIG. 2B, the added band capacitors give the VCO (26 in FIG. 2A) an expanded frequency range from $F_{min}$ to $F_{max}$ which is typically on the order of 30% (of the center frequency of this range). The band capacitors are preferably chosen so that the frequency range of each of the plots 41–46 overlaps the frequency range of an adjacent plot so that there are no frequency gaps in the VCO's tuning range.

As stated in the background section, LO synthesizers in wireless communication systems often need to provide a wide signal range (e.g., 70–300 MHz for GSM systems). Even with its added band capacitors, the VCO 26 does not have sufficient tuning range for such applications. Accordingly, the synthesizer 20 of FIG. 1 inserts a frequency divider 50 into the VCO's output so that the range of the quadrature LO signals 22 can be substantially extended by successively changing a divisor of the frequency divider 50.

Signals produced by the frequency divider 50 must, however, be compatible with parameters of the quadrature demodulator 24 which is representative of demodulators in wireless communication receivers. As mentioned above, modulation strategies of wireless communication systems (e.g., MSK) typically require quadrature LO signals for demodulation.

As an example, the quadrature demodulator 24 of FIG. 1 illustrates a simplified structure which includes first and second mixers 52 that receive the quadrature LO signals 22 and also receive the 1st IF signal from a bandpass filter 53. The mixer products are filtered in lowpass filters 54, detected in threshold detectors 55 and combined in a summer 56 which provides a 2nd IF signal that contains in-phase and quadrature (I and Q) data streams.

Successful quadrature demodulation requires a high degree of accuracy in the quadrature LO signals 22 that feed the first and second mixers 56. This accuracy is best met by initially dividing a signal from the VCO by two to obtain an interim signal with an accurate 50% duty cycle and then realizing first and second divisions of this interim signal. The first and second divisions also divide-by-two but the first division is triggered by rising edges of the interim signal and the second division is triggered by falling edges of the interim signal to thereby generate highly accurate quadrature LO signals. This process requires a total frequency division of 4.

Figure 3A:
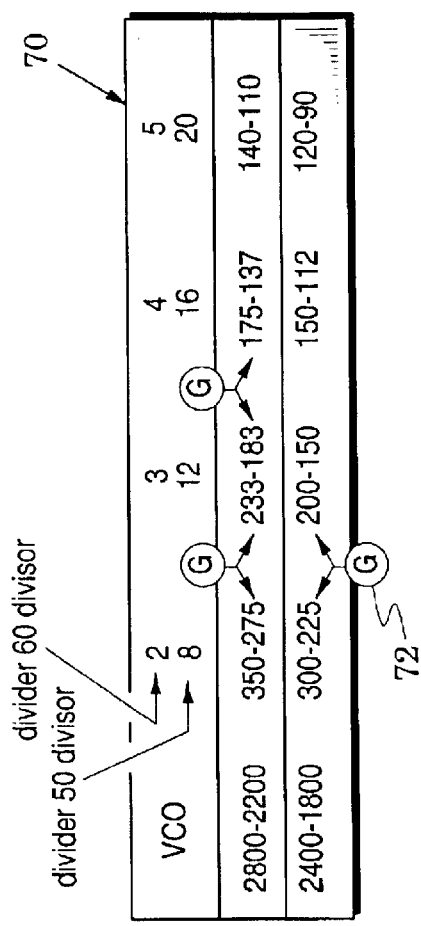
FIGS. 3A and 3B are tables that show frequency ranges of quadrature LO signals in the synthesizer of FIG. 1 as a function of the divisor of a half-rate frequency divider and of VCO process corners in the synthesizer of FIG. 1.

Accordingly, the frequency divider 50 preferably comprises first and second dividers 60 and 62 wherein the second divider 62 has a divisor of 4 to realize accurate quadrature signals and the first divider 60 can have a first divisor which is successively changed to extend the tuning range of the VCO 26. It was disclosed above in the background section that a synthesizer of LO signals for modern communication systems (e.g., the GSM system) preferably generates a wide range (e.g., 70–300 MHz) of signals. The ability of the first divider 60 to provide this range is investigated in the table 70 of FIG. 3.

The table 70 assumes that the frequency of the VCO 26 of FIG. 1 is in the region of 2000 MHz to facilitate multiple divisor possibilities of the frequency divider 60. The table further assumes that fabrication process variations cause the VCO to have an upper process corner in which it generates a frequency range of 1800–2400 MHz and a lower process corner in which it generates a frequency range of 2200–2800 MHz. Frequencies for the quadrature LO signals (22 in FIG. 1) are then entered for different divisors of the frequency dividers 50 and 60 of FIG. 1 wherein, for reasons explained above, it is assumed that the divisor of the second frequency divider 62 is fixed at 4.

It is noted that frequency gaps 72 (indicated by the letter G) appear in the table 70. Changing the divider 60 divisor from 2 to 3, for example, causes the lower and upper process corners to have respective gaps between 200 and 225 MHz and between 233 and 275 MHz. The table indicates that the VCO would fail to provide complete coverage of the desired range of 70–300 MHz of the quadrature LO signals 22 of FIG. 1.

The present invention resolves this failure by proposing that the first frequency divider 60 be a half-rate frequency divider with a half-rate divisor X. This substitution is investigated in the table 80 of FIG. 3B which is similar to the table 70 wherein the half-rate frequency divider 60 now takes on divisors 1.5, 2, 2.5, 3, 3.5 and so on. Although the graph 80 is terminated at divisor 6 for lack of illustration space, it is apparent that the synthesizer 20 of FIG. 1 can now cover a frequency range of 70–300 MHz without any frequency gaps.

Note, for example, that the frequency overlap between adjacent divisors increases so that the absence of frequency gaps for divisors less than or equal to 6 insures there will also be no frequency gaps for half-rate divisors greater than 6. For nomenclature clarity, it is further noted that the half-rate frequency divider 60 and the output frequency divider 62 were initially termed first and second frequency dividers prior to development of the inventive concepts described above.

Figure 4:
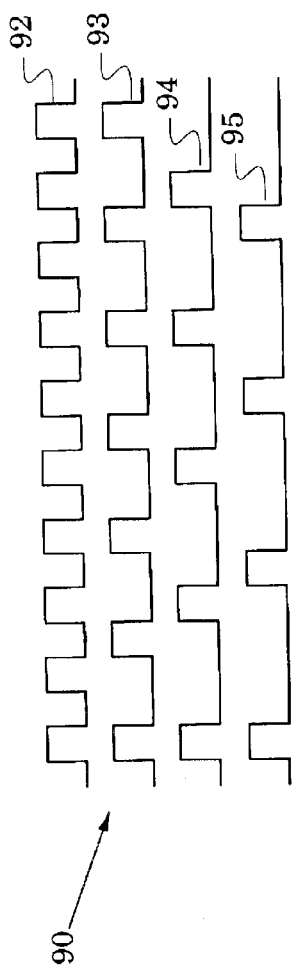
FIG. 4 is a diagram that illustrates divider waveforms in a half-rate frequency divider of FIG. 1.

The graph 90 of FIG. 4 illustrates exemplary half-rate frequency divider processes based on an input signal 92. When alternate rising pulse edges are used as triggers, the half-rate frequency divider has a divisor of 2 and generates an output signal 94 whose rate is ½ the rate of the input signal 92. In contrast, when the rising edge of one pulse and the falling edge of a succeeding pulse are used as triggers, the half-rate frequency divider has a divisor of 1.5 and generates an output signal 93 whose rate is $\frac{1}{1.5}$ the rate of the input signal. When the rising edge of one pulse and the falling edge of a second succeeding pulse are used as triggers, the half-rate frequency divider has a divisor of 2.5° and generates an output signal 95 whose rate is $\frac{1}{2.5}$ the rate of the input signal. Other frequency divisions of a half-rate frequency divider mimic these exemplary processes.

Having explored some of the conceptual background of the invention, attention is now returned to a more complete description of the synthesizer 20 of FIG. 1. The synthesizer generates a highly-stable signal with the aid of a stable oscillator 100 (e.g., a crystal oscillator) and divides this signal with a reference divider 102 to provide a reference signal with a reference frequency $f_{ref}$ to the synthesizer's phase-locked loop 104.

The frequency of the reference signal $f_{ref}$ sets the frequency resolution that the synthesizer 20 can provide. Harmonics of this reference signal will inevitably appear in the quadrature LO signals 22. Although these harmonics will be well reduced by the filtering action of the phase-locked loop, it is still advantageous to control the frequency at which they occur. Accordingly, the reference divider 52 has a selectable divisor R so that the frequency of the reference signal $f_{ref}$ can be selected and the locations of the harmonics can be thereby adjusted by a user of the synthesizer.

The phase-locked loop 104 receives the reference signal $f_{ref}$ and includes the VCO 26 and a loop frequency divider 106 which has a selectable divisor M. The half-rate frequency divider 60 is coupled between the VCO 26 and the loop frequency divider 106 to provide an output signal 110 of the phase-locked loop 104. The half-rate frequency divider 62 processes the loop's output signal 110 into the quadrature LO signals 22. Control of the synthesizer is enhanced by including the half-rate frequency divider 60 in the phase-locked loop 104 rather than positioning it out of the loop with the output frequency divider 62. This advantage will become evident when the loop alignment is subsequently described.

The phase-locked loop 104 is completed by a phase detector 112 coupled to the reference frequency divider 102 and the output signal from the loop frequency divider 106 and a charge pump 113 and a loop filter 114 coupled between the phase detector 112 and the VCO 26. In operation, the phase detector provides a difference signal which corresponds to the phase difference between the reference signal from the reference frequency divider 102 and the output signal from the loop frequency divider 106. In response to the difference signal, the charge pump 113 provides current control signals which are filtered by the loop filter 114 to establish a stable frequency response of the loop.

As described above, the invention divides the frequency divider 50 into a half-rate frequency divider 60 that provides a loop output signal 110 and an output frequency divider 62 that includes two stages of divide-by-two dividers to facilitate processing of the output signal 110 into the quadrature LO signals 22. The half-rate frequency divider 60 provides half-rate division which insures that there are no frequency gaps in a broad range (e.g., 70–300 MHz) of the quadrature LO signals 22.

When the phase-locked loop 104 is locked, the frequency of the output signal from the loop frequency divider 106 will equal the reference frequency $f_{ref}$ and this fact is expressed by equations 120 and 121 of FIG. 1 which may be used in operation of the synthesizer 20. For example, a user of the synthesizer may initially select the frequency $f_{LO}$ of the quadrature LO signals 22 that is suitable for the user's quadrature demodulator 24. Because harmonics of the reference frequency $f_{ref}$ will appear in the loop output signal 110 (and thereby in the quadrature LO signals 22), the user may next indicate a selected reference frequency $f_{ref}$ that positions these harmonics in the most advantageous locations to thereby minimize degradation of the quadrature LO signals.

Figure 3B:
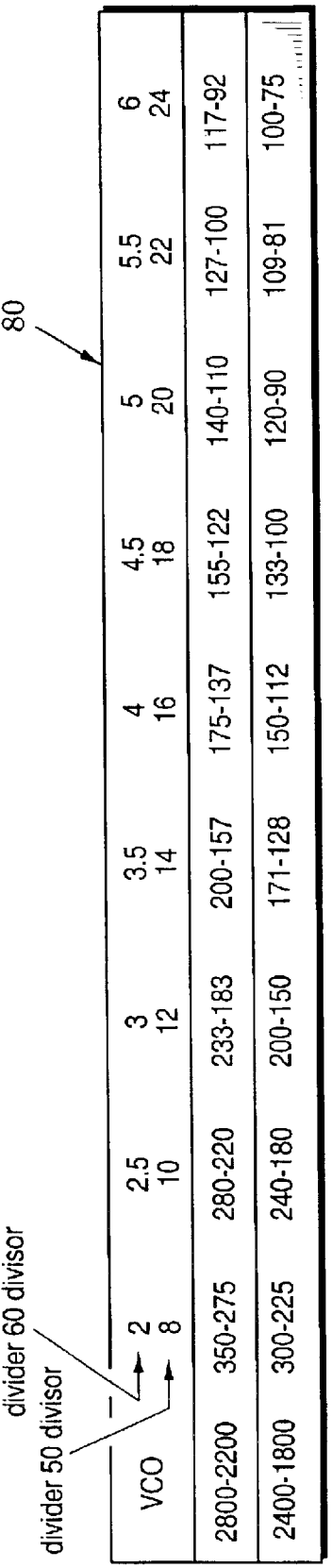

With the reference frequency $f_{ref}$ and the frequency $f_{LO}$ of the quadrature LO signals 22 established, the divisor M of the loop frequency divider 106 is found by equation 120 to be $M=4f_{LO}/f_{ref}$. Equation 121 of FIG. 1 then shows that the divisor X of the half-rate frequency divider is given by $X=(1/M)(f_{VCO}/f_{ref})$. Because process variations cause $f_{VCO}$ to vary between upper and lower process corners (as shown in FIG. 3B) for different VCO's, the synthesizer 20 includes a controller 130 which follows alignment processes exemplified in FIG. 5 to set the divisor X and the number of band capacitors (30 in FIG. 2A) that will successfully lock each VCO to the reference signal.

These alignment processes and their use of equations 120 and 121 may be illustrated with a specific example that begins with an exemplary quadrature demodulator 24 that requires quadrature LO signals 22 set to 230 MHz. Accordingly, the frequency of the loop output signal 110 will be 920 MHz.

If the selected frequency of the stable oscillator 26 is 52 MHz and a user of the synthesizer has indicated that the selected reference frequency is 400 KHz, then the controller 130 uses equation 120 to find that the divisor R should be set to 130 and communicates this via a control path 131 to the reference frequency divider 102. In accordance with equation 120, the controller next determines that the divisor M is $4_{LO}/f_{ref}$ or 2300 and communicates this via a control path 132 to the loop frequency divider 106.

Because the parameters of different VCOs vary between lower and upper process corners, the divisor X of the half-rate frequency divider must be determined with performance feedback from each corresponding VCO. In a method embodiment of the present invention, the controller 130 initially fixes the control voltage $V_c$ at $V_{max}$ (see FIG. 2B) via control path 133 that couples to the output of the loop filter 114 in FIG. 1. The controller also preferably clamps the output signals from the charge pump 113 via control path 134 to prevent disturbance of the fixed voltage at the output of the loop filter.

The controller 130 also decouples all of the band capacitors (30 in FIG. 2A) from the VCO's tank circuit via control line 135. Because the band capacitors are decoupled and the control voltage $V_c$ is fixed at $V_{max}$, the VCO's frequency is now set to the highest-frequency point 140 in FIG. 2B.

Figure 5:
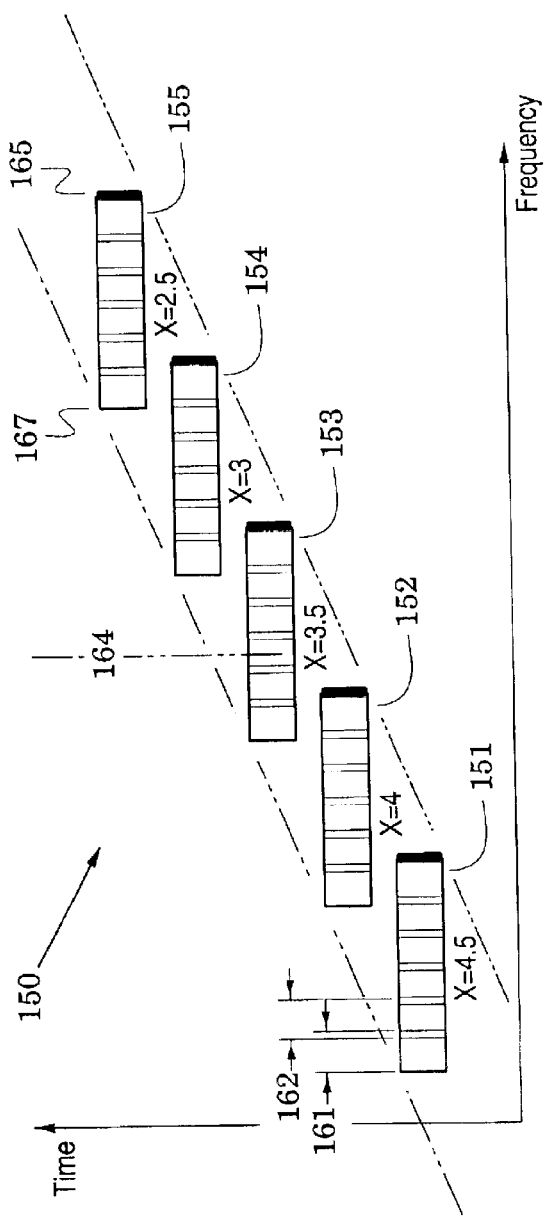
FIG. 5 is a graph that illustrates alignment method embodiments for the synthesizer of FIG. 1.

Attention is now directed to the graph 150 of FIG. 5 in which frequency bars illustrate the frequency of the output signal 110 of FIG. 1 with respect to the divisor X of the half-rate frequency divider 60, the number of band capacitors coupled to the VCO's tank circuit and the VCO's control voltage $V_c$. Frequency bar 151, for example, indicates the frequency range of the output signal when the divisor X is set to 4.5, the number of band capacitors is successively decreased (from left to right in the graph) and the control voltage $V_c$ is ramped from $V_{min}$ to $V_{max}$ (also see FIG. 2B) for each setting of band capacitors.

An exemplary frequency range 161, for example, corresponds to all band capacitors and a ramp of the control voltage from $V_{min}$ to $V_{max}$. Another exemplary frequency range 162 corresponds to one less band capacitor and, again, a ramp of the control voltage from $V_{min}$ to $V_{max}$. It is noted that the frequency range 162 overlaps the frequency range 161 because of the frequency overlap between plots 45 and 46 in FIG. 2B.

To further illustrate alignment processes of the invention, it is assumed that the required output frequency of 920 MHz is indicated by the vertical broken line 164 in FIG. 5. Because the controller 120 initially fixes the control voltage $V_c$ at $V_{max}$ and decouples all of the band capacitors from the VCO's tank circuit, the frequency of each of the frequency bars 151–155 will be positioned at their upper limit as indicated by the dark ends 165 of each frequency bar.

In a method embodiment of the invention, the controller 130 of FIG. 1 successively decreases the divisor X of the half-rate frequency divider 60 via the control path 136 and, for each setting of the divisor X, monitors counter outputs of the loop frequency divider 106 and the reference frequency divider 131 via signal feedback paths 137 and 138.

In particular, the controller resets the count in the loop frequency divider 60 and the reference frequency divider 131 and monitors the completion of an initial count (i.e., the completion of an initial period of the signal frequency exiting the loop frequency divider and the reference frequency divider). If the reference frequency divider is the first to complete its count, then the controller has sensed that the end 165 is lower in frequency than the required output frequency of 920 MHz that is indicated by the line 164.

As shown by FIG. 5, this will occur for settings of 4.5 and 4 for the divisor X of the half-rate frequency divider 60. When the controller 130 sets the divisor X to 3.5 and runs this monitoring step again, the loop frequency divider will be the first to complete its count and, accordingly, the controller 130 senses that the end 165 has passed above the required output frequency of 920 MHz that is indicated by the line 164.

The controller therefore leaves the divisor X set to 3.5 and next decouples all of the band capacitors from the VCO's tank circuit via control line 135 and leaves the control voltage $V_c$ at $V_{max}$ to thereby place the VCO's frequency at the frequency point 141 in FIG. 2B. Subsequently, the controller begins to successively increase the number of band capacitors and, for each increase, runs the monitoring step described above. If the reference frequency divider is the first to complete its count, then the controller has sensed that the frequency range associated with this band capacitor is lower in frequency than the required output frequency of 920 MHz that is indicated by the line 164 in FIG. 5.

When, however, the loop frequency divider 106 is the first to complete its count, then the controller 130 has sensed that the upper end of the frequency range associated with this band capacitor (e.g., frequency plot 44 in FIG. 2B) is now greater in frequency than the required output frequency of 920 MHz that is indicated by the line 164 in FIG. 5. Accordingly, the controller 130 of FIG. 1 now removes the clamps placed earlier on the input and output of the loop filter 114 (via control lines 133 and 134) and thereby permits the phase-locked loop 104 to lock the VCO 26 to the reference frequency at the phase detector 112. The frequency of the VCO 26 will thus be driven by the loop to the frequency point 142 in FIG. 2B where it equals the required output frequency of 920 MHz multiplied by the current setting (i.e., 3.5) of the divisor X of the half-rate frequency divider 60. This goal frequency is indicated in FIG. 2B by the broken line 143 (i.e., output frequency 164 in FIG. 5 multiplied by the divisor X equals the VCO frequency represented by the broken line 143).

The invention facilitates many other alignment embodiments that vary from the embodiment described above. For example, the controller 130 can initially couple all band capacitors to the VCO's tank circuit and clamp the VCO's control voltage at $V_{min}$ to set the VCO's frequency at the minimum-frequency point 144 in FIG. 2B. Subsequently, the controller can successively decrease the divisor X of the half-rate frequency divider 106 in FIG. 1 until it senses that the lower-frequency end 167 of one of the frequency bars (e.g., 151–155) is lower in frequency than the required output frequency of 920 MHz.

The controller can next leave the VCO's control voltage at $V_{min}$ and decouple all band capacitors to set the VCO's frequency at the frequency point 145 in FIG. 2B. Subsequently, the controller can successively add band capacitors until it senses that the lower end of the frequency range associated with this band capacitor (e.g., frequency plot 44 in FIG. 2B is now less in frequency than the required output frequency of 920 MHz. Accordingly, the controller 130 of FIG. 1 now removes the clamps placed earlier on the input and output of the loop filter 114 (via control lines 133 and 134) and permits the phase-locked loop 104 to lock the VCO 26 to the reference frequency at the phase detector 112.

There are numerous other alignment variations that differ from those described above but which are all embodiments of the invention's general alignment method for locking a voltage-controlled oscillator (VCO) to a reference signal from a reference frequency divider to thereby provide an output signal with a selected output frequency.

The general method begins with the process steps of positioning a half-rate frequency divider with a divisor X between the VCO and a loop frequency divider to provide the output signal, setting the divisor R of the reference frequency divider to obtain a selected reference frequency of the reference signal and setting the divisor M of the loop frequency divider to the ratio between the selected output frequency and the selected reference frequency.

The general method then continues with the process steps of fixing the control voltage of the VCO at a predetermined point in the range of the control voltage, coupling a predetermined number of band capacitors to the VCO, successively incrementing the divisor X and, subsequent to the incrementing step, successively altering the number. The method continues with a process step of halting the incrementing and altering steps in response to counter outputs of the reference frequency divider and the loop frequency divider that indicate relationships between a current output frequency and the selected output frequency that facilitate phase lock. The method is completed with a process step of releasing the VCO control voltage to phase lock the VCO to the reference signal.

It is noted that the halting step can be realized with various embodiments. For example, it may include the process steps of monitoring the counter outputs to observe the relationships and stopping the incrementing and altering steps when the monitoring step indicates a divisor X and a number of band capacitors that permit the phase-locked loop to lock the VCO to the reference signal.

In contrast, the halting step may include the process steps of monitoring the output of the phase detector 112 (or, alternatively, the output of the charge pump 113) to observe the relationships and stopping the incrementing and altering steps when the monitoring step indicates a divisor X and a number of band capacitors that permit the phase-locked loop to lock the VCO to the reference signal.

In synthesizer embodiments of the invention, the half-rate frequency divider 60, the output frequency divider 62 and the reference frequency divider 131 are typically realized with counters and the loop frequency divider 106, in particular, may be realized with a dual modulus prescaler. Controllers of the invention can be realized with logic gate networks and/or with a digital processor and a program storage device that has instructions, readable and executable by the processor, that control the process steps of the invention.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of locking a voltage-controlled oscillator (VCO) to a reference signal from a reference frequency divider to thereby provide an output signal with a selected output frequency wherein said VCO and a loop frequency divider are coupled in a phase-locked loop that receives said reference signal, the method comprising the steps of:

positioning a half-rate frequency divider with a divisor X between said VCO and said loop frequency divider to provide said output signal;

setting the divisor R of said reference frequency divider to obtain a selected reference frequency of said reference signal;

setting the divisor M of said loop frequency divider to the ratio between said selected output frequency and said selected reference frequency;

fixing the control voltage of said VCO at a predetermined point in the range of said control voltage;

coupling a predetermined number of band capacitors to said VCO;

successively incrementing said divisor X;

subsequent to said incrementing step, successively altering said number;

halting said incrementing and altering steps in response to counter outputs of said reference frequency divider and said loop frequency divider which indicate relationships between a current output frequency and said selected output frequency that facilitate phase lock; and releasing said VCO control voltage to phase lock said VCO to said reference signal.

2. The method of claim 1, wherein said halting step includes the steps of:
   monitoring said counter outputs to observe said relationships; and
   stopping said incrementing and altering steps when said monitoring step indicates a divisor X and a number of band capacitors that permit said phase-locked loop to lock said VCO to said reference signal.

3. The method of claim 1, wherein said halting step includes the steps of:
   monitoring the output of a phase detector of said phase-locked loop to observe said relationships; and
   stopping said incrementing and altering steps when said monitoring step indicates a divisor X and a number of band capacitors that permit said phase-locked loop to lock said VCO to said reference signal.

4. The method of claim 1, wherein said selectable divisor X includes at least one of 1.5, 2, 2.5, 3, 3.5, 4, 4.5, 5, 5.5, 6, 6.5, 7, 7.5 and 8.

5. The method of claim 1, wherein said predetermined point is at the upper limit of said range.

6. The method of claim 1, wherein said predetermined point is at the lower limit of said range.

7. The method of claim 1, wherein said number is zero.

8. The method of claim 1, wherein said number represents all available band capacitors.

9. The method of claim 1, wherein said incrementing step includes the step of increasing said divisor X.

10. The method of claim 1, wherein said incrementing step includes the step of decreasing said divisor X.

11. The method of claim 1, wherein said altering step includes the step of decreasing said number.

12. The method of claim 1, wherein said altering step includes the step of increasing said number.

13. The method of claim 1, further including the step of frequency dividing said output signal with a divisor of 4 to thereby provide quadrature down-converter signals.

14. The method of claim 1, wherein said loop frequency divider is a dual-modulus prescaler.

15. A frequency synthesizer that provides an output signal with a selected output frequency, comprising:
   a reference frequency divider that has a selectable divisor R to thereby provide a selected reference frequency;
   a phase-locked loop that receives said reference signal and includes:
      a) a voltage-controlled oscillator (VCO) whose frequency corresponds to a control voltage;
      b) a plurality of band capacitors that can be coupled to said VCO to alter its frequency;
      c) a loop frequency divider with a selectable divisor M; and
      d) a half-rate frequency divider having a selectable divisor X and coupled between said VCO and said loop frequency divider to provide said output signal; and
   a controller configured to perform the steps of:
      a) setting said divisor R to obtain said selected reference frequency;
      b) setting said divisor M to the ratio of said selected output frequency to said selected reference frequency;
      c) fixing said control voltage at a predetermined point in its range;
      d) coupling a predetermined number of said band capacitors to said VCO;
      e) successively incrementing said divisor X;
      f) subsequent to said incrementing step, successively altering said number;
      g) halting said incrementing and altering steps in response to counter outputs of said reference frequency divider and said loop frequency divider which indicate relationships between a current output frequency and said selected output frequency that facilitate phase lock; and
      h) releasing said VCO control voltage to phase lock said VCO to said reference signal.

16. The synthesizer of claim 15, further including an output frequency divider with a divisor of 4 that provides quadrature output signals.

17. The synthesizer of claim 15, further including an input oscillator that couples an input signal to said reference frequency divider.

18. The synthesizer of claim 15, wherein said halting step includes the steps of:
   monitoring said counter outputs to observe said relationships; and
   stopping said incrementing and altering steps when said monitoring step indicates a divisor X and a number of band capacitors that permit said phase-locked loop to lock said VCO to said reference signal.

19. The synthesizer of claim 15, wherein said halting step includes the steps of:
   monitoring the output of a phase detector of said phase-locked loop to observe said relationships; and
   stopping said incrementing and altering steps when said monitoring step indicates a divisor X and a number of band capacitors that permit said phase-locked loop to lock said VCO to said reference signal.

20. The synthesizer of claim 15, wherein said selectable divisor X includes at least one of 1.5, 2, 2.5, 3, 3.5, 4, 4.5, 5, 5.5, 6, 6.5, 7, 7.5 and 8.

21. The synthesizer of claim 15, wherein said predetermined point is at the upper limit of said range.

22. The synthesizer of claim 15, wherein said predetermined point is at the lower limit of said range.

23. The synthesizer of claim 15, wherein said number is zero.

24. The synthesizer of claim 15, wherein said number represents all of said band capacitors.

25. The synthesizer of claim 15, wherein said incrementing step includes the step of increasing said divisor X.

26. The synthesizer of claim 15, wherein said incrementing step includes the step of decreasing said divisor X.

27. The synthesizer of claim 15, wherein said incrementing step includes the step of increasing said divisor X.

28. The synthesizer of claim 15, wherein said altering step includes the step of decreasing said number.

29. The synthesizer of claim 15, wherein said altering step includes the step of increasing said number.

30. The synthesizer of claim 15, wherein said controller includes:
   a digital processor; and
   a program storage device having instructions, readable and executable by said processor, that control said steps.

31. The synthesizer of claim 15, wherein said controller includes a plurality of digital gates configured to control said steps.

* * * * *